US012684841B2

(12) United States Patent
Derrickson et al.

(10) Patent No.: US 12,684,841 B2
(45) Date of Patent: Jul. 14, 2026

(54) GATE STRUCTURE ON INTRINSIC BASE LAYER AND OVERHANGING LATERAL SIDEWALL OF INTRINSIC BASE LAYER

(71) Applicant: GlobalFoundries U.S. Inc., Malta, NY (US)

(72) Inventors: Alexander M. Derrickson, Saratoga Springs, NY (US); Hong Yu, Clifton Park, NY (US); Judson Robert Holt, Ballston Lake, NY (US); Andreas Knorr, Saratoga Springs, NY (US); Vibhor Jain, Clifton Park, NY (US); Jeffrey Bowman Johnson, North Hero, VT (US); Alexander L. Martin, Greenfield Center, NY (US); Jhnanesh Somayaji, Bangalore (IN)

(73) Assignee: GlobalFoundries U.S. Inc., Malta, NY (US)

( * ) Notice: Subject to any disclaimer, the term of this patent is extended or adjusted under 35 U.S.C. 154(b) by 380 days.

(21) Appl. No.: 18/426,813

(22) Filed: Jan. 30, 2024

(65) Prior Publication Data

US 2025/0248088 A1     Jul. 31, 2025

(51) Int. Cl.
| | |
|---|---|
| *H10D 62/17* | (2025.01) |
| *H10D 30/60* | (2025.01) |
| *H10D 62/13* | (2025.01) |
| *H10D 64/01* | (2025.01) |

(52) U.S. Cl.
CPC ......... *H10D 62/177* (2025.01); *H10D 30/611* (2025.01); *H10D 62/136* (2025.01); *H10D 62/137* (2025.01); *H10D 64/021* (2025.01)

(58) Field of Classification Search
CPC ... H10D 10/821; H10D 10/021; H10D 10/054
See application file for complete search history.

(56) References Cited

U.S. PATENT DOCUMENTS

| | | | |
|---|---|---|---|
| 6,649,983 B2 | 11/2003 | Chatterjee | |
| 6,828,635 B2 | 12/2004 | Panday et al. | |
| 6,858,486 B2 | 2/2005 | Chatterjee | |
| 9,064,799 B2 | 6/2015 | Chen et al. | |
| 9,123,562 B2 | 9/2015 | Blatchford | |
| 2019/0131439 A1* | 5/2019 | Cheng ................... | H10D 12/00 |
| 2023/0178638 A1* | 6/2023 | Cai ...................... | H10D 62/116 |
| | | | 257/197 |
| 2025/0098190 A1* | 3/2025 | Derrickson .......... | H10D 10/821 |

* cited by examiner

*Primary Examiner* — Alia Sabur
(74) *Attorney, Agent, or Firm* — Francois Pagette; Hoffman Warnick LLC

(57) ABSTRACT

A structure including a first emitter-collector (E/C) layer over a substrate. The structure further includes an intrinsic base layer over the first E/C layer and a second E/C layer over the intrinsic base layer. The structure includes an extrinsic base layer on the intrinsic base layer and adjacent the second E/C layer. The structure includes a gate structure on the intrinsic base layer and overhanging a lateral sidewall of the intrinsic base.

20 Claims, 7 Drawing Sheets

GATE STRUCTURE ON INTRINSIC BASE LAYER AND OVERHANGING LATERAL SIDEWALL OF INTRINSIC BASE LAYER

STATEMENT REGARDING FEDERAL RIGHTS

This invention was made with government support under DARPA T-MUSIC program Agreement No. HR0011-20-3-0002 awarded by the United States Department of Defense. The government has certain rights in the invention.

BACKGROUND

Embodiments of the disclosure relate generally to integrated circuit (IC) structures. More particularly, the disclosure relates to structures and methods to provide gate structures on an intrinsic base layer and overhanging lateral sidewalls of the intrinsic base layer.

Integrated circuit (IC) chips have billions of devices thereon, such as transistors, capacitors, and resistors. As devices shrink, the number of electrical shorts between components increases. Electrical shorts between components can lead to device failure, thereby adversely affecting device longevity and reliability. Therefore, reducing undesired electrical shorts between components improves longevity and reliability of devices formed on IC chips.

SUMMARY

An aspect of the disclosure includes a structure, including a first emitter-collector (E/C) layer over a substrate; an intrinsic base layer over the first E/C layer; a second E/C layer over the intrinsic base layer; an extrinsic base layer on the intrinsic base layer and adjacent the second E/C layer; and a gate structure on the intrinsic base layer and overhanging a lateral sidewall of the intrinsic base layer.

Another aspect of the disclosure includes a structure including a first emitter-collector (E/C) layer over a substrate; an intrinsic base layer over the first E/C layer; a second E/C layer over the intrinsic base layer; an extrinsic base layer on the intrinsic base layer and adjacent the second E/C layer; an E/C terminal on the first E/C layer and laterally distal to the intrinsic base layer; and a gate structure on the E/C terminal and overhanging a lateral sidewall of E/C terminal.

Another aspect of the disclosure includes a structure a method including forming a first emitter-collector (E/C) layer over a substrate; forming an intrinsic base layer over the first E/C layer; forming a second E/C layer over the intrinsic base layer; forming an extrinsic base layer on the intrinsic base layer and adjacent the second E/C layer; and forming a gate structure on the intrinsic base layer and overhanging a lateral sidewall of the intrinsic base layer.

It should be noted that all aspects, examples, and features of disclosed embodiments mentioned herein can be combined in any technically possible way. That is, two or more aspects of any of the disclosed embodiments, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein.

Figure 1:
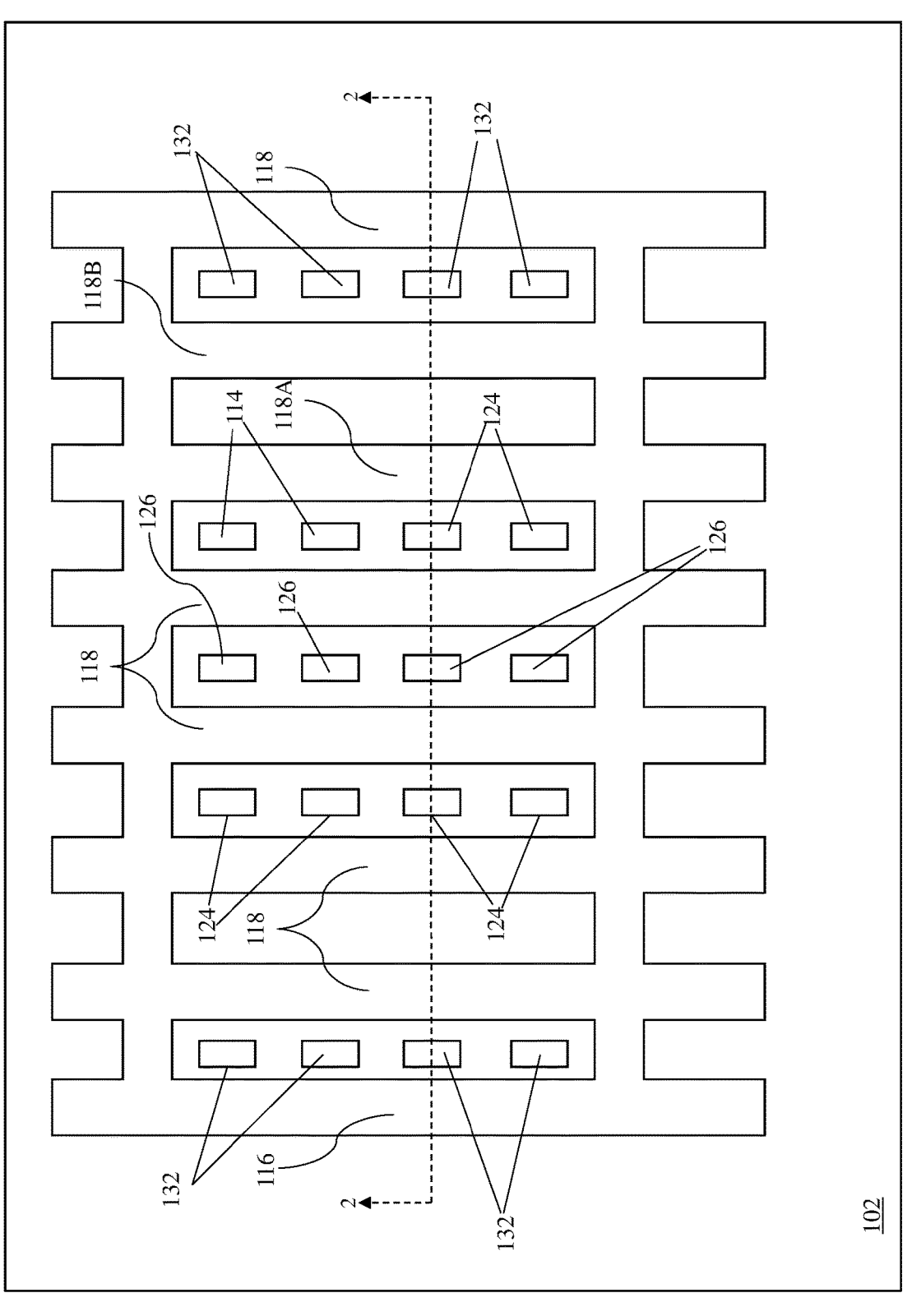
FIG. 1 shows a top-down view of a structure according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B," and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure include a structure including a first emitter-collector (E/C) layer over a substrate. The structure further includes an intrinsic base layer over the first E/C layer and a second E/C layer over the intrinsic base layer. The structure includes an extrinsic base layer on the intrinsic base layer and adjacent the second E/C layer. The structure includes a gate structure on the intrinsic base layer and overhanging a lateral sidewall of the intrinsic base layer. By including a gate structure overhanging a lateral sidewall of the intrinsic base layer, structures of the disclosure exhibit less electrical shorting than conventional devices, e.g., due to canted surfaces forming at interfaces of epitaxially-grown layers abutting non-silicon materials.

Figure 2:
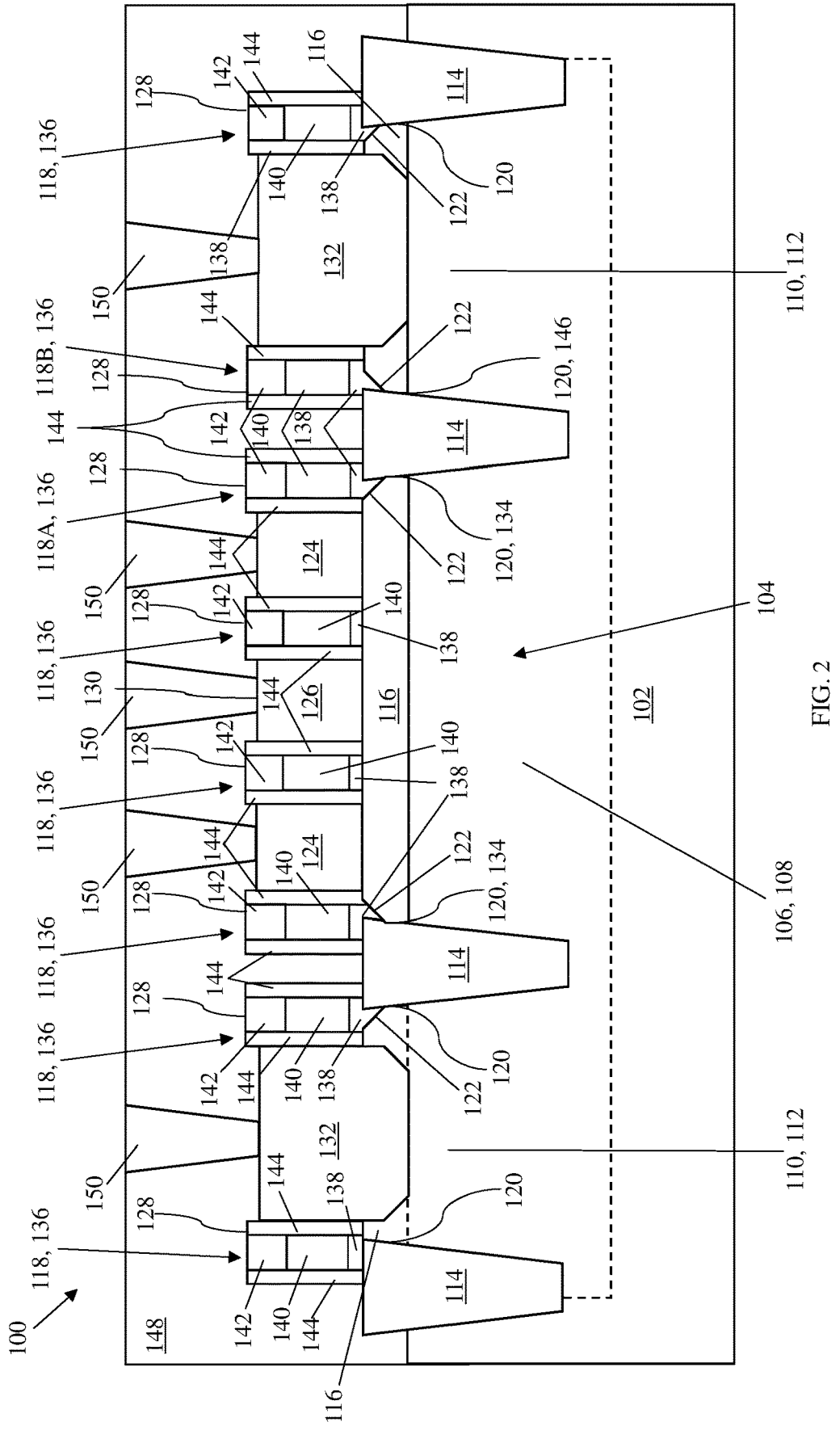
FIG. 2 shows a cross-sectional view along view line 2-2 in FIG. 1 of a structure including two gate structures over respective lateral sidewalls, according to embodiments of the disclosure.
Figure 3:
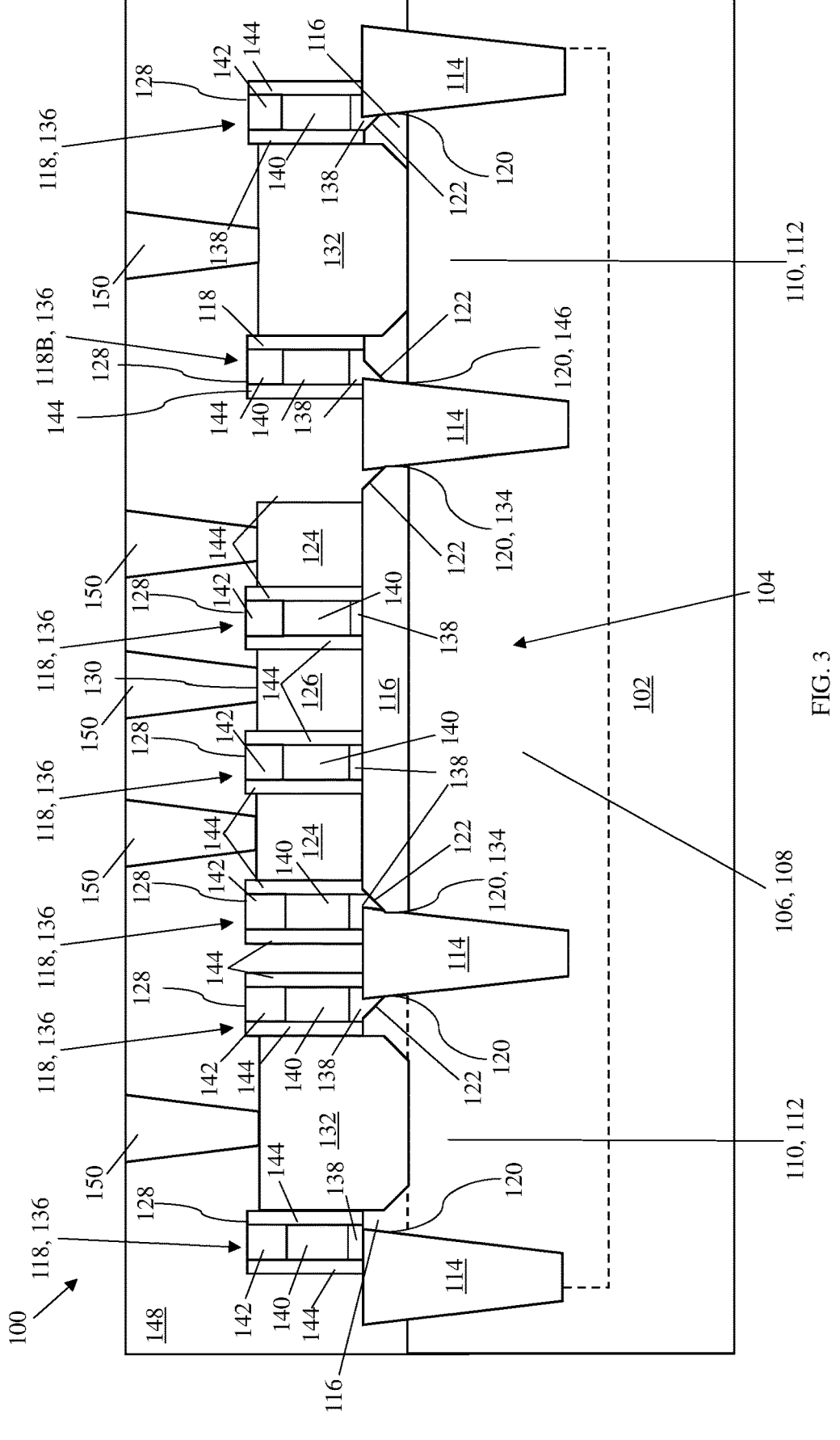
FIG. 3 shows a cross-sectional view of a structure including a gate structure over a lateral sidewall, according to embodiments of the disclosure.
Figure 4:
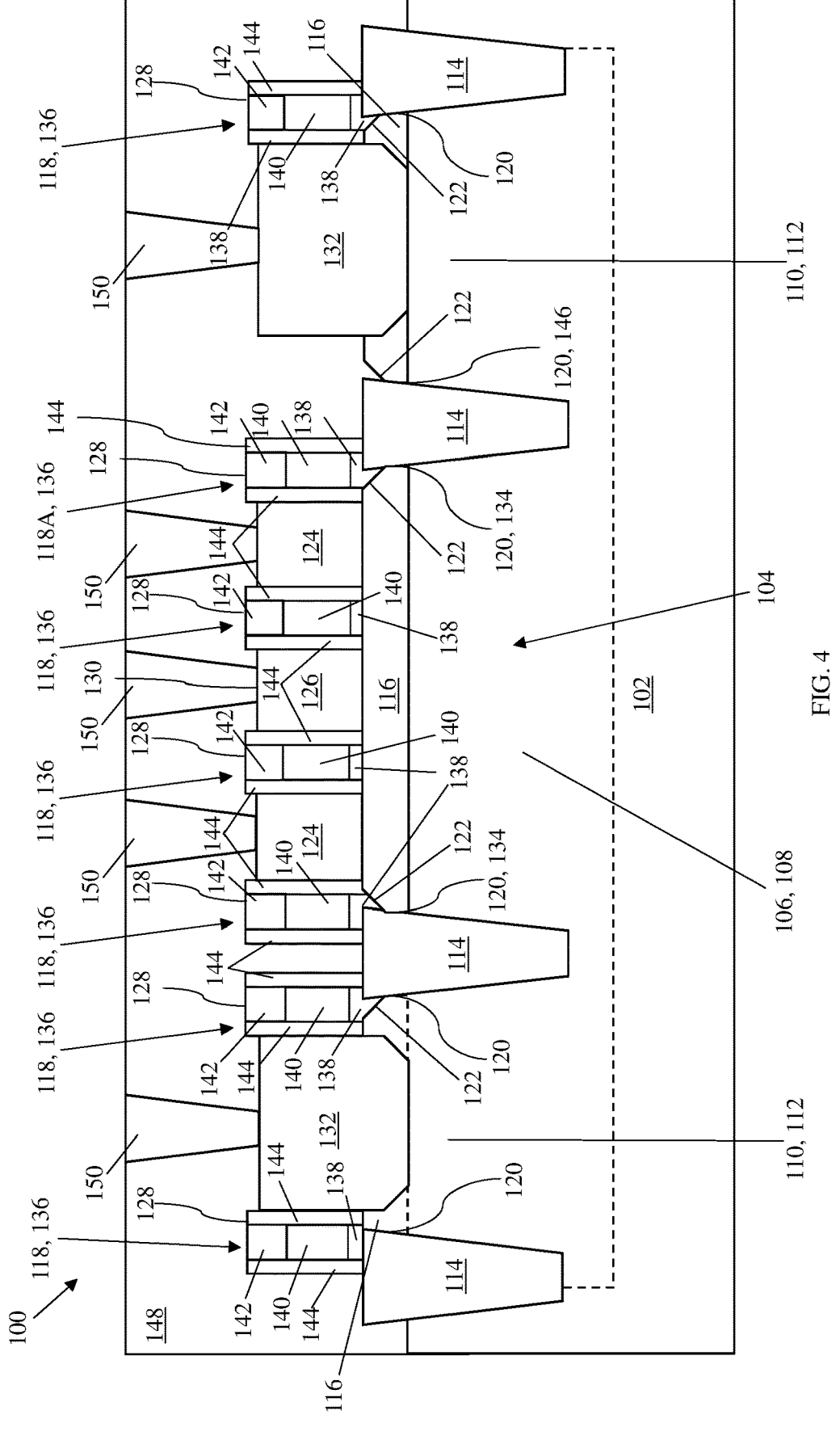
FIG. 4 shows a cross-sectional view of a structure including a gate structure over a lateral sidewall, according to embodiments of the disclosure.
Figure 5:
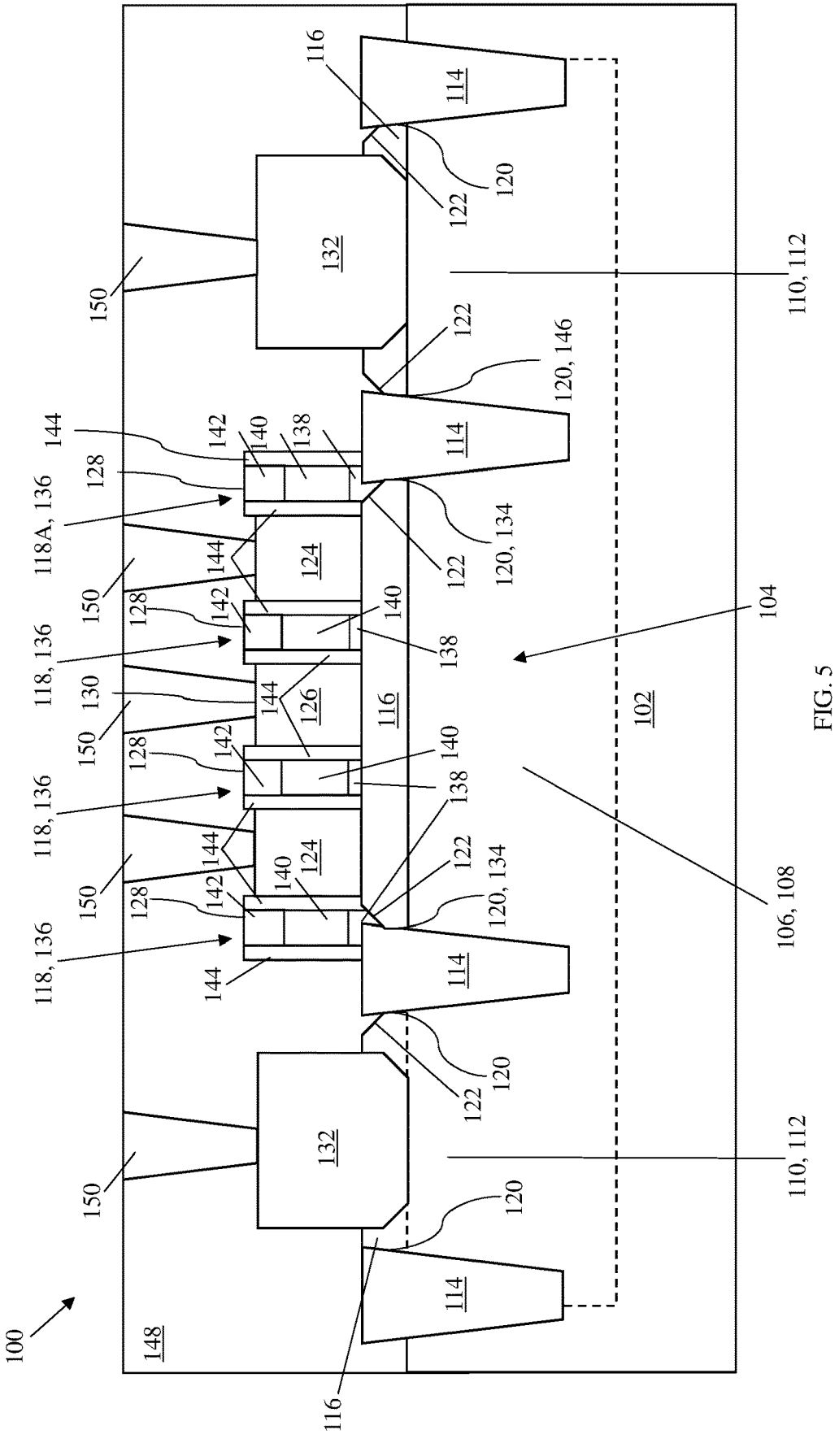
FIG. 5 shows a cross-sectional view of a structure including a gate structure over a lateral sidewall, according to embodiments of the disclosure.

FIG. 1 shows a top-down view of a structure 100. 1. FIG. 2 shows a cross-sectional view of structure 100 along view line 2-2 in FIG. 1. FIGS. 3-5 show cross-sectional views of alternative embodiments of structure 100. Structure 100 may take the form of, or include, any semiconductor or microelectronic device, such transistors, capacitors, resistors, inductors, etc.

Referring to FIG. 1, structure 100 may include a substrate 102. Substrate 102 may provide, e.g., mechanical support to portions of structure 100 thereover. Substrate 102 may include any known or future material capable of being a substrate, including any known or future-discovered semiconductors. Substrate 102 may include but is not limited to silicon, germanium, silicon germanium (SiGe), silicon carbide, or any other common integrated circuit (IC) semiconductor substrates. In the case of SiGe, the germanium concentration in substrate 102 may differ from other SiGe-based structures described herein. A portion or entirety of substrate 102 may be strained.

Embodiments of structure 100 may be directed toward vertically-oriented bipolar transistors; specifically, vertically-oriented heterojunction bipolar transistor (HBT) in a fin field-effect transistor (FET) structure. A bipolar transistor is a semiconductor a device including an emitter, collector, and base that regulates current flow in the emitter and collector terminals by applying varying electrical currents to the base. An HBT is a type of bipolar transistor that includes different semiconductor materials for its emitter and collector regions, as discussed in further detail herein.

Referring now to FIGS. 2-5, structure 100 may include a deep well 104 within substrate 102. A "deep well" refers to doped semiconductor material located underneath active device components and/or other wells. By contrast, a "shallow well" is an area of doped semiconductor material located beneath active device components but not to the same depth as a deep well. Hence, it is possible for a highly doped active semiconductor material to be located inside of a shallow well or deep well, and/or for the shallow well in turn to be located inside of a deep well. Additional levels of wells may be provided in further device structures, e.g., to produce a "triple well" stack of doped semiconductor materials and/or more complex arrangements of layers having distinct doping polarities and/or types. Depending on the attributes of a device to be manufactured, portions of semiconductor material on or over substrate 102 may be a first doping type, i.e., either n-type or p-type doped. Deep well 104 may include an intermediate portion 106 between two lateral portions 110A and 110B each including a first emitter/collect (E/C) layer 108, thereby electrically coupling first E/C layer 108 to an E/C terminal 112 or E/C terminals 112 over respective lateral portions 110A and 110B. An E/C region is terminal of, e.g., a bipolar junction transistor (BJT) or HBT and are discussed fully herein, and an E/C terminal is a structure through which charge carriers (i.e., electrons and holes) may flow between first E/C layer 108 and regions above structure 100 (not shown).

Structure 100 may include trench isolation (TI) structures 114 adjacent an intrinsic base layer 116 and below gate structures 118. Generally, a TI structure is a trench etched in a substrate and filled with an insulating material such as oxide, to isolate one region of structure 100 from an adjacent region of structure 100. Intrinsic base layer 116 is a conductive terminal in structure 100 through which charge carriers (i.e., electrons and holes) flow when structure 100 is in an operational state, and gate structures 118 are, as described fully herein, structures used to electrically isolate portions of structure 100 thereunder. In some implementations, TI structure(s) 114 may surround intrinsic base layer 116. In such implementation, TI structures 114 may be immediately laterally adjacent to intrinsic base layer 114. TI structures 114 may have coplanar upper surfaces. Each TI structure 114 may be formed of any currently-known or later developed substance for providing electrical insulation, and as examples may include: silicon nitride (Si3N4), silicon oxide (SiO2), fluorinated SiO2 (FSG), hydrogenated silicon oxycarbide (SiCOH), porous SiCOH, boro-phospho-silicate glass (BPSG), silsesquioxanes, carbon I doped oxides (i.e., organosilicates) that include atoms of silicon (Si), carbon I (C), oxygen (O), and/or hydrogen (H), thermosetting polyarylene ethers, a spin-on silicon-carbon containing polymer material, near frictionless carbon (NFC), or layers thereof.

Structure 100 may include first emitter/collector (E/C) layer 108 over substrate 102 and within intermediate portion 106 of deep well 104. An E/C region is terminal of, e.g., a bipolar junction transistor (BJT) or HBT. For example, in some implementations, an E/C region may take the form of a device emitter or a device collector. First E/C layer 108 may have charge carriers (i.e., electrons and holes) flowing therethrough when structure 100 is in an operational state by applying a current to intrinsic base layer 116, as discussed herein. First E/C layer 108 may include a semiconductor material having the first doping type, such as p-type or n-type doping. "Doping" and "dopants" herein refer to altering a semiconductor material's conducting properties by introducing an impurity therein. Different impurities (i.e., different dopants) can be used to achieve different conductivity types (e.g., p-type conductivity and n-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve p-type conductivity, whereas a silicon-based semiconductor material is typically doped a Group V dopant, such as arsenic (As), phosphorous (P) or antimony (Sb), to achieve n-type conductivity. A gallium nitride (GaN)-based semiconductor material is typically doped with magnesium (Mg) to achieve p-type conductivity and with silicon (Si) or oxygen to achieve n-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

Structure 100 may include an intrinsic base layer 116 over first E/C layer 108. An intrinsic base layer is a relatively lightly doped terminal of, e.g., a BJT or an HBT. Intrinsic base layer 116 initially may include a semiconductor material similar to first E/C layer 108, but has a second (opposite) doping type, such as p or n type doping. As shown in FIG. 1, intrinsic base layer 116 may abut other materials (such as, e.g., TI structure 114). When intrinsic base layer 116 is formed by epitaxial growth in a position abutting a non-silicon material (e.g., TI structure 114), intrinsic base layer 116 may fail to lattice match thereto, thereby creating an interface 120 and/or canted surface 122 (i.e., slanted, or faceted relative to another surface) where intrinsic base layer 116 abuts the non-silicon material. In some circumstances, canted surfaces 122 may cause undesirable electrical shorts between portions of structure 100 adjacent canted surfaces 122.

Structure 100 may include one or more second E/C layer(s) 124 over intrinsic base layer 116. Second E/C layer(s) 124 define another terminal in, e.g., a BJT or an HBT, and may be substantially similar or even the same as first E/C layer 108. Second E/C layer(s) 124 may be vertically over intrinsic base layer 116. Second E/C layer 124 has the same doping type as first E/C layer 108 such that layers 108, 116, and 124 together define a set of "NPN" or "PNP" junctions thereacross. That is, if first E/C region 108 takes the form of, e.g., a device emitter, then second E/C region 124 may take the form of a device collector. Likewise, if first E/C region 108 takes the form of, e.g., a device collector, then second E/C region 124 may take the form of a device emitter. One or more gate structures 118 may be on intrinsic base layer 116 and adjacent second E/C layer 124 to reduce or prevent electrical shorting as described in further detail elsewhere herein.

Structure 100 may include an extrinsic base layer 126 on a part of intrinsic base layer 116 that is laterally distal to second E/C layer 124. Extrinsic base layer 126 may be, e.g., vertically over part of intrinsic base layer 116. Extrinsic base layer 126 may have the same doping type as intrinsic base layer 116 and possibly the same semiconductor composition, but has significantly greater amounts of doping (i.e., includes a higher concentration of dopants therein and thus is more conductive). Extrinsic base layer 126, during operation, provides a stronger region of electrical coupling between a base contact and intrinsic base layer 116. Extrinsic base layer 126 also may be adjacent one or more gate structures 118. An upper surface 128 of gate structure 118 may be above an upper surface 130 of extrinsic base layer 126, but this is not necessarily required in all implementations.

Structure 100 may include an E/C terminal 112 on first E/C layer 108 and laterally distal to intrinsic base layer 116 and an E/C contact 132 on E/C terminal 112. An E/C terminal is a portion of structure 100 to which a voltage may be applied through an E/C contact 132 to supply charge carriers to E/C terminal 112 when structure 100 is in operation. In some implementations, E/C terminal 112 may include an epitaxially-grown semiconductor. Specifically, in some implementations, E/C terminal 112 may include silicon germanium. E/C terminals 112 and E/C contacts 132 may include the second doping type. E/C terminal 112 may include any semiconducting material, and E/C contact 132 may include any semiconducting material or metal. The contact metal may any now known or later developed contact metal and may include aluminum or copper within a refractory metal liner of tantalum nitride (TaN); however, other refractory metals such as tantalum (Ta), titanium (Ti), ruthenium (Ru), tungsten (W), iridium (Ir), rhodium (Rh) and platinum (Pt), etc., or mixtures of thereof, may also be employed. E/C contact 132 may include silicide regions (not shown), i.e., portions of semiconductor that are annealed in the presence of an overlying conductor to increase the electrical conductivity of semiconductor regions. to increase the electrical conductivity at their physical interface with E/C contact 132, where applicable. E/C terminals 112 may be within respective lateral portions 110A and 110B of deep well 104, whereby deep well 104 may electrically connect E/C terminal 112 (and E/C contact(s) 132 thereon) to first E/C layer 108. TI(s) 114 may physically and electrically separate E/C terminal 112 and E/C contact 132 from first E/C layer 108, intrinsic base layer 116, and second E/C layer 124.

Structure 100 may include gate structures 118 on intrinsic base layer 116 and overhanging a lateral sidewall 134 of intrinsic base layer 116. A gate structure is, generally, a terminal that may be present in a field-effect transistor for controlling conductivity in a semiconductor channel region thereunder. Here, however, gate structures 118 in embodiments of structure 100 may not be connected to an electronic signal (i.e., gate structures 118 may be "dummy gates" or "floating"). Gate structures 118 may include one of a polycrystalline semiconductor and a metal in some implementations. In other implementations, gate structures 118 may include a high-k material. As mentioned, upper surfaces 128 of gate structure 118 may be above upper surface 130 of extrinsic base layer 126. In some implementations, a respective gate structure 118 may be between extrinsic base 116 and any second E/C layers 124. Gate structures 118 may further include a gate stack 136, e.g., a series of material layers that constitute individual gate structures 118. Gate stacks 136 may include a gate dielectric 138 over lateral sidewall 134 of intrinsic base layer 116. Gate dielectric layer 138 may include an insulative material such as any now known or later developed gate dielectric materials including, but not limited to, hafnium silicate (HfSiO), hafnium oxide (HfO2), zirconium silicate (ZrSiOx), zirconium oxide (ZrO2), silicon oxide (SiO2), silicon nitride (Si3N4), silicon oxynitride (SiON), high-k material or any combination of these materials. Gate stack 136 may also include a gate conductor 140 over gate dielectric 138. Gate conductor 140 may include any now known or later developed gate conductor, such as copper (Cu). Gate stack 136 may include a gate cap 142 over gate conductor 140, including, for example, a nitride. Gate structures 118 may further include respective pairs of spacers 144 on either side of respective gate stack 136 and may include any now known or later developed spacer material, such as silicon nitride.

At least some gate structures 118 may be located over an interface 120 and/or canted surface 122 within structure 100. For instance, gate structure(s) 118 may be adjacent (and may surround, as indicated in FIG. 1) second E/C layer 124. In another embodiment, shown in FIG. 2, structure 100 may include gate structure 118 (hereinafter "gate structure 118A") on intrinsic base layer 116 and overhanging lateral sidewall 134 of intrinsic base layer 116, thereby covering interfaces 120 and/or canted surfaces 122. Thus, gate structure 118A is distinct from other gate structures 118 described herein in that it is overhanging lateral sidewall 134 of intrinsic base layer 116. Also, in the embodiment shown in FIG. 2, structure 100 may include an additional gate structure 118 (hereinafter "gate structure 118B") on E/C contact 132 and overhanging lateral sidewall 146 of E/C terminal 112, thereby covering interfaces 120 and/or canted surfaces 122. Gate structure 118B is therefore distinct from other gate structures 118 in that it is overhanging lateral sidewall 146 of E/C terminal 112. In another embodiment, shown in FIG. 3, gate structure 118A may optionally not overhang lateral sidewall 134 of intrinsic base layer 116. However, in yet another embodiment, shown in FIG. 4, structure 100 may include gate structure 118A on intrinsic base layer 116 and overhanging lateral sidewall 134 of intrinsic base layer 116 but not additional gate structure 118B over E/C contact 132 and overhanging lateral sidewall 146 of E/C terminal 112. In a further embodiment, shown in FIG. 5, E/C terminals 112 may not have any gate structures 118 therearound.

By including gate structures 118 over interfaces 120 and/or canted surfaces 122, structure 100 may experience less electrical shorting relative to similar devices, and therefore have increased reliability and lifespan. That is, gate structures 118 may conformally overhang interfaces 120 and/or canted surfaces 122, as shown in FIGS. 2-5, which electrically isolates interfaces 120 and/or canted surfaces 122 thereunder. In particular, gate dielectric layer 138 and/or spacers 144 may conformally overhang interfaces 120 and/or canted surfaces 122. One skilled in the art will understand that although several combinations of gate structures over interfaces 120 and canted surfaces 122 are illustrated in FIGS. 2-5 for simplicity, any combination of gate structures 118 may be present or absent in structure 100.

Structure 100 may include an inter-layer dielectric (ILD) layer 148 over gate structures 118 to electrically, physically, and/or thermally isolate various components of structure 100 from one another. Suitable dielectric materials include but are not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning).

Structure 100 may include metal contacts 150 on second E/C layer 124, extrinsic base layer 126, or E/C contacts 132. Metal contacts 150 are conductive pillars electrically coupling second E/C layer 124, extrinsic base layers 126, or E/C contacts 132 to metal layers overhead (not shown). Metal contacts 150 may include refractory metal liner, and a contact metal. The refractory metal liner (not labeled for clarity) may include, for example, titanium nitride. The contact metal may be any now known or later developed contact metal such as but not limited to tungsten (W).

Figure 6:
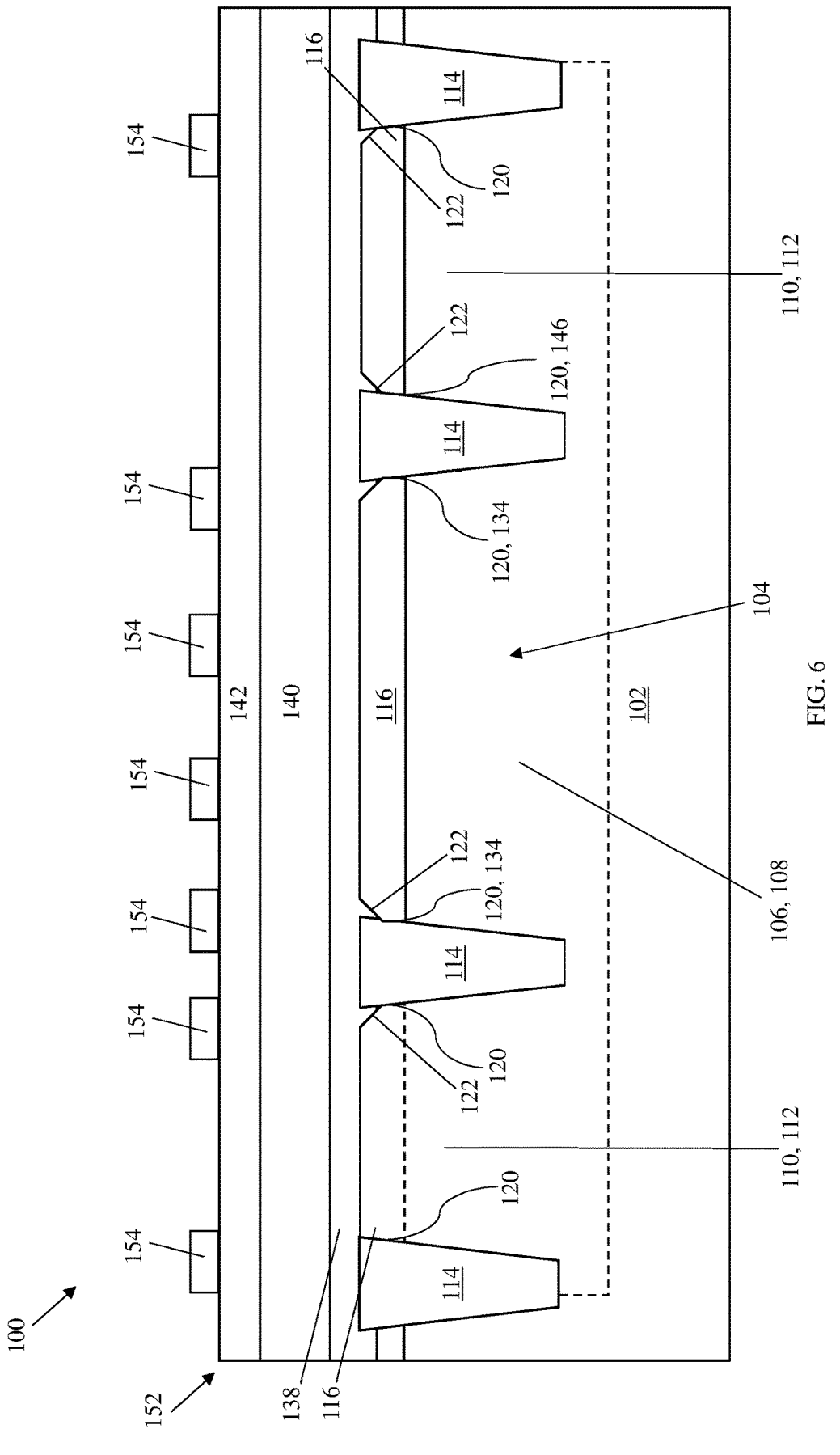
FIG. 6 shows forming a gate stack layer in methods according to embodiments of the disclosure.
Figure 7:
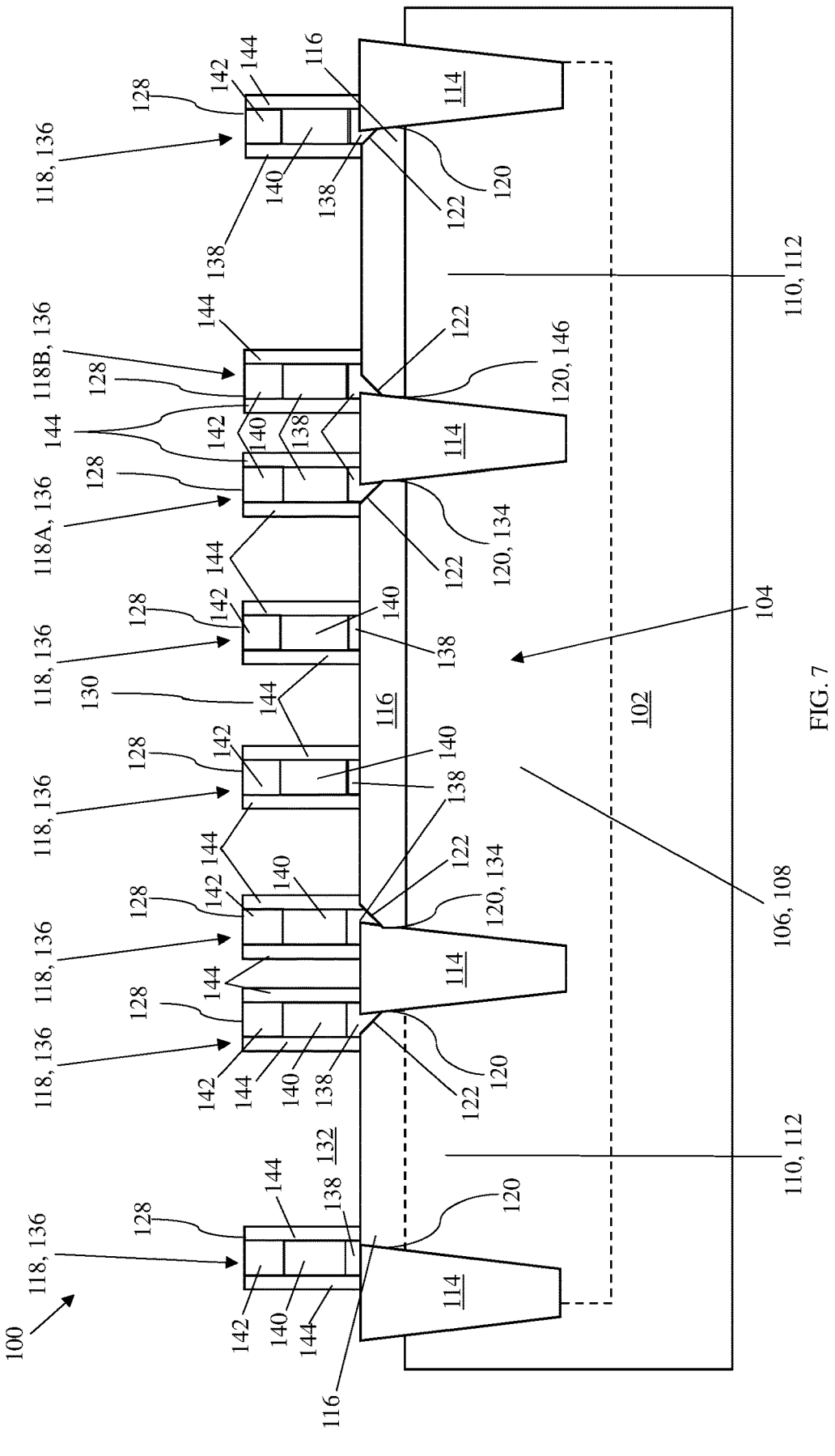
FIG. 7 shows forming gate structures in methods according to embodiments of the disclosure.

Embodiments of the disclosure provide methods to form a structure according to various embodiments. FIGS. 6 and 7 show cross-sectional views of a structure at various stages of fabrication.

Referring to FIG. 6, methods disclosed herein may include forming deep well 104 within substrate 102. Deep well 104 may be formed by, e.g., doping substrate 102. An ion implanter is typically employed for the actual implantation of dopants within substrate 102. An inert carrier gas such as nitrogen is usually used to introduce the impurity source (dopant) to substrate 102. Deep well 104 may be formed including two lateral portions 110 with intermediate portion 106 therebetween.

Methods disclosed herein may include forming TI structures 114 adjacent intrinsic base layer 116 and below gate structure 118. Trench isolation may be, e.g., deposited in trenches in substrate 102. "Deposition" and "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RT-CVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

After deposition, trench isolation structures 114 may be planarized through, e.g., chemical mechanical planarization, which gives trench isolation structures 114 substantially coplanar upper surfaces. Planarization refers to various processes that make a surface more planar (that is, flattened and/or smoothened). Chemical-mechanical-polishing ("CMP") is one currently conventional planarization process which planarizes surfaces with a combination of chemical reactions and mechanical forces. CMP uses slurry including abrasive and corrosive chemical components along with a polishing pad and retaining ring, typically of a greater diameter than the wafer. The pad and wafer are pressed together by a dynamic polishing head and held in place by a plastic retaining ring. The dynamic polishing head is rotated with different axes of rotation (that is, not concentric). This process removes material and tends to even out any "topography," making the wafer flat and planar. Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; and/or (x) sacrificial etch-back.

Still referring to FIG. 6, the methods disclosed herein may include forming first emitter-collector (E/C) layer 108 over substrate 102 and within intermediate portion of deep well 104. First E/C layer 108 may be formed by deposition or doping portions of substrate 102 or formed epitaxially. The terms "epitaxial growth" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial growth process, the chemical reactants provided by the source gases are controlled and the system parameters are set so that the depositing atoms arrive at the deposition surface of the substrate 102 with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth processes may be selective to forming on semiconductor surfaces, and may not deposit material on dielectric surfaces, such as silicon dioxide or silicon nitride surfaces.

After TI structures 114 are formed in substrate 102, an etch step is performed to reduce the vertical height of substrate 102, i.e., the upper surface of deep well is reduced. "Etching" generally refers to the removal of material from a substrate (or structures formed on the substrate) and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g., silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as TI trenches.

Still referring to FIG. 6, methods disclosed herein may include forming intrinsic base layer 116 over first E/C layer 108. Similar to first E/C layer 108 intrinsic base layer 116 may be formed by, e.g., deposition or epitaxy. Because substrate 102 was etched, intrinsic base layer 116 is epitaxially grown such that it may have substantially coplanar upper surfaces with TIs 114. As intrinsic base layer 116 is formed, interfaces 120 and/or canted surfaces 122 may form concurrently due to formation of material at interface(s) 120.

Methods disclosed herein may include forming gate structures 118 on intrinsic base layer 116 and overhanging lateral sidewall 134 of intrinsic base layer 116. Gate structures 118 may be formed by forming a gate stack layer 152 including gate dielectric 138 (e.g., an insulator) over substrate 102, gate conductor 140 (e.g., polycrystalline semiconductor or a gate metal) over gate dielectric 138, and a gate cap 142 (e.g., a nitride) over gate conductor 140, as shown in FIG. 6. Then gate stack layer 152 is patterned to form individual gate structures 118, as described herein. Gate stack layer 152 may be, e.g., deposited on substrate 102.

Methods disclosed herein may include forming a mask 154 over gate stack layer 152 to pattern gate structures 118. The term "mask" may be given to a layer of material which is applied over an underlying layer of material, and patterned to have openings, so that the underlying layer can be processed where there are openings. After processing the underlying layer, the mask may be removed. Common masking materials are photoresist (resist) and nitride. Nitride is usually considered to be a "hard mask." Mask may include a developable organic planarization layer (OPL) on the layer to be etched, a developable anti-reflective coating (ARC) layer on the developable OPL, and a photoresist mask layer on the developable ARC layer. Masks may be removed using any known removal process appropriate for the mask material, e.g., a wet etch for hard nitride mask or an ashing process (oxygen dry strip process) for a soft resist-based mask. Mask 154 may be, e.g., deposited on gate stack layer 140.

Referring now to FIGS. 6-7, forming individual gate structures 118 may further include patterning gate stack layer 152 to form gate stacks 136 with spaces therebetween, as show in FIG. 7, i.e., gate structures 118 may be formed including gate stacks 136. Gate stack layer 152 may be patterned by, e.g., lithography and/or etch. In lithography (or "photolithography"), a radiation sensitive "resist" coating is formed over one or more layers which are to be treated, in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The patterned resist can then serve as a mask for the underlying layers which can then be selectively treated, such as to receive dopants and/or to undergo etching, for example.

Once patterned, gate stack layer 152 becomes individual gate stacks 136, which may be formed/patterned to include gate dielectric 138 over lateral sidewall 134 of intrinsic base layer 116, and gate conductor 140 over gate dielectric 138, as shown in FIG. 7. Gate stacks 136 are formed over interfaces 120 and/or canted surfaces 122 to electrically isolate them thereunder.

Referring now to FIG. 7, forming gate structures 118 may include forming pairs of spacers 144 on either side of respective gate stacks 136. Forming gate structures 118 may include forming gate structures 118 with upper surfaces 128 above upper surface 130 of extrinsic base layer 126. Gate structures 118 may be formed including one of a polycrystalline semiconductor and a metal.

Methods disclosed herein may include forming second E/C layer 124 over intrinsic base layer 116 and forming extrinsic base layer 126 on intrinsic base layer 116 and adjacent second E/C layer 124. Second E/C layer 124 and extrinsic base layer 126 may be formed substantially similarly to first E/C layer 108 and extrinsic base layer 126, respectively, i.e., through deposition or doping, or epitaxially. Second E/C layer 124 and extrinsic base layer 126 may be formed between gate structures 118, as shown in FIGS. 1-5.

Methods disclosed herein may include forming E/C terminal 112 on first E/C layer 108 and laterally distal to intrinsic base layer 116 and forming E/C contact 132 on E/C terminal 112. E/C terminals 112 may be formed within lateral portions 110 of deep well 104 and may include an epitaxially-grown semiconductors and/or metal materials.

Forming structure 100 may include forming an ILD layer 148 over gate structures 118 to arrive at completed structure 100, shown in FIG. 2, by, e.g., depositing insulative materials thereover to electrically, physical, and/or thermally isolate components of structure 100 from one another.

Structure 100 may include metal contacts 150 on second E/C layer 124, extrinsic base layer 126, or E/C contacts 132.

Metal contacts 150 are conductive pillars electrically coupling second E/C layer 124, extrinsic base layers 126, or E/C contacts 132 to metal layers overhead (not shown). Forming metal contacts 150 in ILD 148 may include any now known or later developed contact forming processes. In one non-limiting example, metal contacts 150 may be formed by patterning a mask, etching contact openings to the respective structures, and forming a conductor in the openings. Metal contacts 150 may include forming refractory metal liner, and a contact metal thereover via, e.g., deposition.

Embodiments of the disclosure include a gate structure 118 overhanging a lateral sidewall 134 of the intrinsic base layer 116. By including a gate structure 118 overhanging a lateral sidewall 134 of the intrinsic base layer 116 in structure 100, structure 100 does not experience electrical shorting due to canted surfaces forming at interfaces of epitaxially-grown layers abutting non-silicon materials.

The method and structure as described above are used in the fabrication and operation of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure, comprising:
a first emitter-collector (E/C) layer over a substrate;
an intrinsic base layer over the first E/C layer;
a second E/C layer over the intrinsic base layer;
an extrinsic base layer on the intrinsic base layer and adjacent the second E/C layer; and
a gate structure on the intrinsic base layer and overhanging a lateral sidewall of the intrinsic base layer.

2. The structure of claim 1, wherein an upper surface of the gate structure is above an upper surface of the extrinsic base layer.

3. The structure of claim 1, further comprising a trench isolation structure adjacent the intrinsic base layer and below the gate structure.

4. The structure of claim 1, wherein the gate structure includes one of a polycrystalline semiconductor, a metal, and a high-k material.

5. The structure of claim 1, wherein the gate structure further includes:
a gate stack, including:
a gate dielectric over the lateral sidewall of the intrinsic base, and
a gate conductor over the gate dielectric; and
a pair of spacers on either side of the gate stack.

6. The structure of claim 1, wherein the gate structure surrounds the second E/C layer.

7. The structure of claim 6, wherein the extrinsic base layer is between the second E/C layer and the gate structure.

8. The structure of claim 1, further comprising:
an E/C terminal on the first E/C layer and laterally distal to the intrinsic base layer;
an E/C contact on the E/C terminal; and
an additional gate structure on the E/C terminal and overhanging a lateral sidewall of the E/C terminal.

9. A structure, comprising:
a first emitter-collector (E/C) layer over a substrate;
an intrinsic base layer over the first E/C layer;
a second E/C layer over the intrinsic base layer;
an extrinsic base layer on the intrinsic base layer and adjacent the second E/C layer;
an E/C terminal on the first E/C layer and laterally distal to the intrinsic base layer; and
a gate structure on the E/C terminal and overhanging a lateral sidewall of E/C terminal.

10. The structure of claim 9, wherein the gate structure includes one of a polycrystalline semiconductor, a metal, and a high-k material.

11. The structure of claim 9, wherein the gate structure further includes:
a gate stack, including:

a gate dielectric over the lateral sidewall of the intrinsic base, and a gate conductor over the gate dielectric; and a pair of spacers on either side of the gate stack.

12. The structure of claim 9, wherein the E/C terminal includes an epitaxially-grown semiconductor.

13. The structure of claim 9, wherein the E/C terminal includes silicon germanium.

14. The structure of claim 9, wherein the gate structure surrounds the second E/C layer.

15. The structure of claim 14, further comprising an additional gate structure overhanging a lateral sidewall of the intrinsic base layer.

16. A method, comprising:

forming a first emitter-collector (E/C) layer over a substrate;

forming an intrinsic base layer over the first E/C layer;

forming a second E/C layer over the intrinsic base layer;

forming an extrinsic base layer on the intrinsic base layer and adjacent the second E/C layer; and forming a gate structure on the intrinsic base layer and overhanging a lateral sidewall of the intrinsic base layer.

17. The method of claim 16, wherein an upper surface of the gate structure is above an upper surface of the extrinsic base layer.

18. The method of claim 16, further comprising a trench isolation structure adjacent the intrinsic base layer and below the gate structure.

19. The method of claim 16, wherein the gate structure includes one of a polycrystalline semiconductor, a metal, and a high-k material.

20. The method of claim 16, wherein the gate structure further includes:

a gate stack, including:

a gate dielectric over the lateral sidewall of the intrinsic base layer, and a gate conductor over the gate dielectric; and a pair of spacers on either side of the gate stack.

* * * * *